United States Patent
Sumi et al.

(10) Patent No.: US 7,397,720 B2
(45) Date of Patent: Jul. 8, 2008

(54) SEMICONDUCTOR STORAGE DEVICE INCLUDING ELECTRICAL FUSE MODULE

(75) Inventors: Shinichi Sumi, Hyogo (JP); Hirohito Kikukawa, Osaka (JP); Yasuhiro Agata, Osaka (JP); Masanori Shirahama, Shiga (JP); Toshiaki Kawasaki, Osaka (JP); Ryuji Nishihara, Osaka (JP); Yasue Yamamoto, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 111 days.

(21) Appl. No.: 11/501,039

(22) Filed: Aug. 9, 2006

(65) Prior Publication Data

US 2007/0058411 A1  Mar. 15, 2007

(30) Foreign Application Priority Data

Aug. 11, 2005  (JP) .............................. 2005-232687

(51) Int. Cl.
G11C 17/18 (2006.01)
G11C 17/00 (2006.01)

(52) U.S. Cl. ..................................... 365/225.7; 365/96

(58) Field of Classification Search .............. 365/225.7, 365/96, 200

See application file for complete search history.

(56) References Cited

U.S. PATENT DOCUMENTS

| 5,708,291 | A | 1/1998 | Bohr et al. ................... 257/529 |
| 6,798,272 | B2 * | 9/2004 | Lehmann ..................... 327/525 |
| 6,876,586 | B1 * | 4/2005 | Hausmann ............. 365/189.12 |
| 6,992,945 | B2 | 1/2006 | Otsuka ..................... 365/225.7 |
| 2005/0076274 | A1 | 4/2005 | Nagai et al. ................. 714/718 |

* cited by examiner

Primary Examiner—Anh Phung
(74) Attorney, Agent, or Firm—Steptoe & Johnson LLP (57) ABSTRACT

Electrical fuse blocks (100) of a plurality of stages are provided each of which includes a plurality of electrical fuse cores (101). The electrical fuse block (100) includes a program shift register block (103) made up of shift registers (107) which are disposed for the respective electrical fuse cores (101), sequentially transmit program enable signal FPGI, and output the program enable signal FPGI to the NMOS transistors (105) of the electrical fuse cores (101). When performing programming according to programming decision signal PBn, the program shift register block (103) transmits the program enable signal FPGI. When not performing programming, the program shift register block (103) skips the program enable signal FPGI.

5 Claims, 9 Drawing Sheets

SEMICONDUCTOR STORAGE DEVICE INCLUDING ELECTRICAL FUSE MODULE

FIELD OF THE INVENTION

The present invention relates to OTP (One Time Programmable) memory using a semiconductor, and particularly relates to a semiconductor storage device including an electrical fuse module in which fuse elements can be blown and programmed by passage of current.

BACKGROUND OF THE INVENTION

Conventionally, electrical fuse modules (electrical fuse devices) are configured using electrical fuse elements made of polysilicon or the like and have been widely used for semiconductor integrated circuits (LSI) for trimming program devices or the like of high-frequency semiconductor devices. In semiconductor integrated circuits including such electrical fuse devices, electrical fuse elements are programmed by passing a large current of about 1 A to melt the fuse elements by means of bipolar transistors.

In recent years, for example, as disclosed in National Publication of International Patent Application No. 11-512879, the following process has been developed for semiconductor integrated circuits: a metallic material is formed as a gate material on polysilicon by silicification to reduce the resistance of the gate material. Accordingly, a technique for electrical fuse elements has become available which uses a mechanism for cutting a silicide layer on a top surface and increasing a resistance by passing current through the a gate material. In the case of 130-nm and 90-nm process generations, when melting electrical fuse elements by passage of current, such melting requires an instantaneous carrying current of 10 to 30 mA for each electrical fuse element.

When such an electrical fuse device is used for a trimming device or the like of a high-frequency device, the number of mounted electrical fuse elements is not more than four to eight for each chip of a system LSI. Thus the electrical fuse elements can be melted at a time using a tester.

Further, instead of conventionally used metal fuses, the electrical fuse elements for cutting silicide on polysilicon have been used to repair defective memory of RAM such as DRAM and SRAM.

However, the number of mounted electrical fuse elements for redundancy repair of RAM incorporated in a system LSI is 500 to 1000 for each chip. Thus when using the electrical fuse device for redundancy repair of RAM, an instantaneous carrying current of about 10 A (10 to 30 mA for each electrical fuse element) is necessary to program 1000 electrical fuse elements at a time. However, it is difficult for an existing general-purpose tester to supply a current of 10 A according to such programming and pass a current of 10 A concentratedly to an electrical fuse device in an LSI chip, so that a special tester is necessary.

Also in the case where 1000 electrical fuse circuit blocks are separately provided as electrical fuse devices and electrical fuse elements are melted one by one, a number of control terminals are necessary (an electrical fuse circuit block with four control terminals requires 4000 control terminals). Thus such electrical fuse devices cannot be mounted in a system LSI.

DISCLOSURE OF THE INVENTION

It is an object of the present invention to solve these problems and provide a semiconductor storage device including an electrical fuse module whereby even when a number of electrical fuse elements are necessary for, for example, redundancy repair of RAM, the electrical fuse elements can be easily mounted in an LSI and the electrical fuse elements can be easily melted and programmed using an existing general-purpose tester, and when using an electrical fuse as OTP memory mountable in a consumer appliance with, for example, a secure ID, writing can be performed in a shorter time with low power consumption.

In order to attain the object, the present invention comprises electrical fuse blocks of two or more stages each including a plurality of electrical fuse cores in each of which programming can be performed by passing current through a fuse element and melting the fuse element by driving a switch. The electrical fuse block includes a program shift register block made up of shift registers which are disposed for the respective electrical fuse cores, sequentially transmit a program enable signal, and output the program enable signal to the switches of the electrical fuse cores. The shift registers in the program register block sequentially transmit, only in the electrical fuse block to be programmed, the program enable signal and programming is performed by melting the fuse elements based on the data signals of the electric fuse cores. The program enable signal skips and is transmitted, in the electrical fuse block not to be programmed, to the electrical fuse blocks of the subsequent stage and later.

According to this configuration, the fuse elements are melted one by one using the program enable signal transferred by means of the program shift register block, so that the fuse elements can be melted using an existing general-purpose tester without a special tester. Further, since the program enable signal skips in the electrical fuse block not to be programmed, the data programming time can be shortened, the power consumption of programming can be reduced, and the electrical fuse block having not been programmed can be skipped during verification, thereby reducing the check time.

DESCRIPTION OF THE EMBODIMENTS

The inventor of the present invention invented an electrical fuse module (electrical fuse circuit) by which even when a number of electrical fuse elements are necessary for, for example, RAM redundancy repair or the like, the electrical fuse elements can be easily mounted in an LSI and the electrical fuse elements can be easily melted and programmed using an existing general-purpose tester, and the inventor filed a patent application for the invention at the USPTO on Jan. 4, 2006. The application Ser. No. is "11/324,243". Since the present invention is based on the invention of the electrical fuse module having been applied for a patent at the USPTO, the following will first describe the electrical fuse module in accordance with FIGS. 8 to 10.

Figure 8:
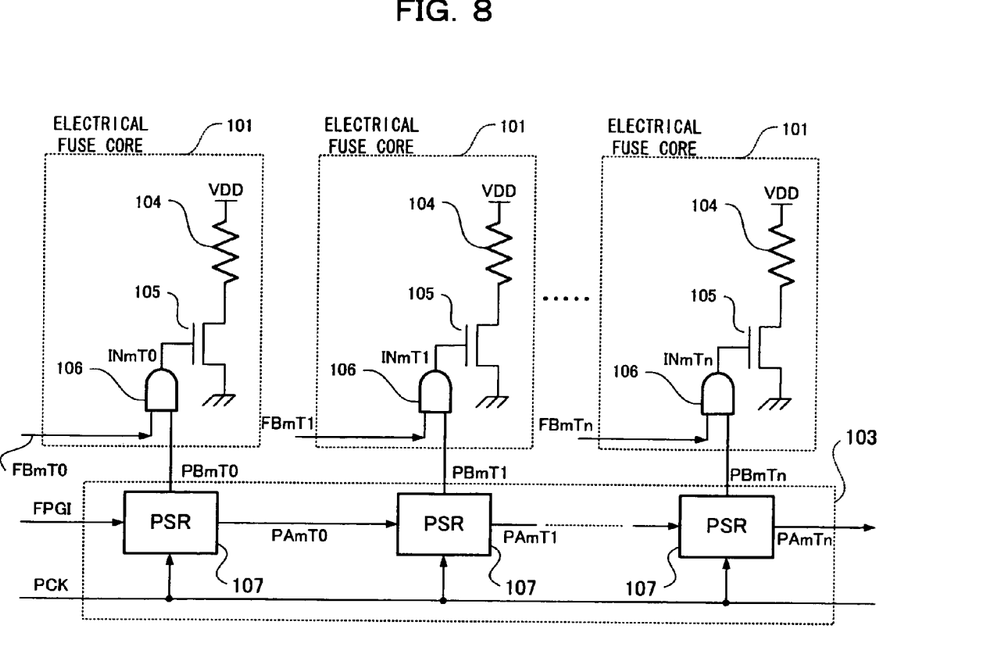
FIG. 8 is a circuit diagram showing the electrical fuse module.

FIG. 8 is a circuit diagram showing the electrical fuse module in which (two or more) n (n is an integer not smaller than 2) fuse elements are configured as a single module.

In FIG. 8, reference numeral 101 denotes electrical fuse cores and reference numeral 103 denotes a program shift register block including n stages.

Each of the electrical fuse cores 101 is made up of an electrical fuse element 104 having one end connected to a power supply (VDD), an NMOS transistor (an example of a switch) 105, and a two-input AND circuit 106.

The NMOS transistor 105 is connected in series with the electrical fuse element 104 and the source of the NMOS transistor 105 is connected to a ground terminal. Programming is performed by passing current through the electrical fuse element 104 and melting the electrical fuse element 104.

The two-input AND circuit 106 is fed with program data signal FBmTi (i=1 to n) and program enable signal PBmTi (i=1 to n) from the program shift register block 103 and outputs program signal INmTi (i=1 to n) to be inputted to the gate of the NMOS transistor 105.

The program shift register block 103 is made up of shift registers 107 of n stages. The shift registers 107 are serially connected in such a way that program enable signal FPGI is inputted to the first stage and the output of the previous stage is connected to the input of the subsequent stage through the first stage to the n-th stage (program enable transmission signals PAmT1 to PAmTn). Program clock signal PCK is connected in a shared manner from the first stage to the n-th stage of the shift registers 107 of the program shift register blocks 103. Further, the program enable signals PBmT1 to PBmTn outputted from the shift registers 107 of n stages in the program shift register block 103 are connected respectively as the program enable signals of the electrical fuse cores 101 of the first stage to the n-th stage.

Figure 9:
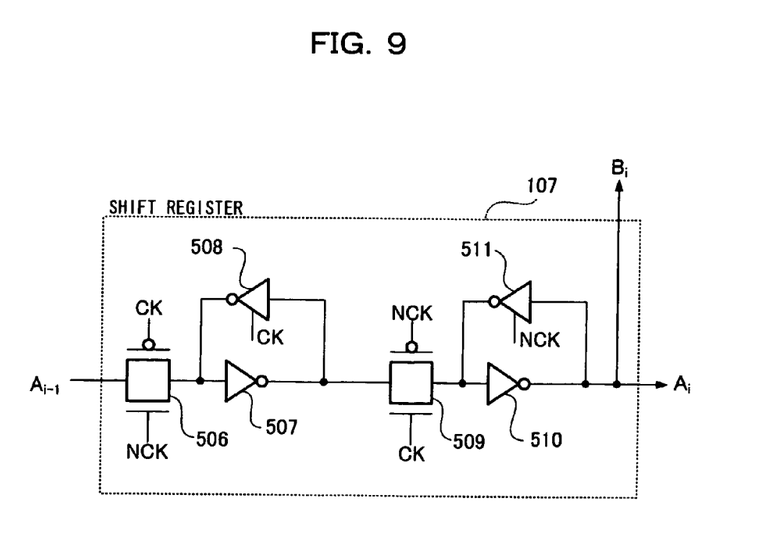
FIG. 9 is a circuit diagram showing the configuration of a shift register in the electrical fuse module of FIG. 8 and the electrical fuse modules of Embodiments 1 and 3 of the present invention.

Referring to FIG. 9, the following will discuss a specific circuit configuration of the shift register 107 shown in FIG. 8. FIG. 9 is a circuit diagram showing the configuration of the shift register 107 of the i-th stage shown in FIG. 8.

The shift register 107 shown in FIG. 9 is made up of a CMOS gate circuit 506, an inverter circuit 507 fed with the output of the CMOS gate circuit 506, a tristate inverter circuit 508, a CMOS gate circuit 509, an inverter circuit 510 which is fed with the output of the CMOS gate circuit 509 and outputs program enable transmission signal Ai and the program enable signal PBmTi, and a tristate inverter circuit 511.

In the CMOS gate circuit 506, the gate of a PMOS transistor is connected to clock signal CK (corresponding to the program clock signal PCK in FIG. 8), the gate of an NMOS transistor is connected to inverted signal NCK of clock signal CK, and the input of the CMOS gate circuit 506 is connected to program enable transmission signal Ai−1 (corresponding to PAmTi−1 in FIG. 8) which is the output of the (i−1)th stage.

The tristate inverter circuit 508 is fed with the output of the inverter circuit 507 and uses the clock signal CK as a control signal (enabled at High). The output of the tristate inverter circuit 508 is connected to the node of the output of the CMOS gate circuit 506 and the input of the inverter circuit 507.

In the CMOS gate circuit 509, the gate of a PMOS transistor is connected to inverted signal NCK of the clock signal CK, the gate of an NMOS transistor is connected to the clock signal CK, and the input of the CMOS gate circuit 509 is connected to the output of the inverter circuit 507.

The tristate inverter circuit 511 is fed with the output of the inverter circuit 510 and uses the inverted signal NCK of the clock signal CK as a control signal (enabled at High). The output of the tristate inverter circuit 511 is connected to the node of the output of the CMOS gate circuit 509 and the input of the inverter circuit 510.

Figure 10:
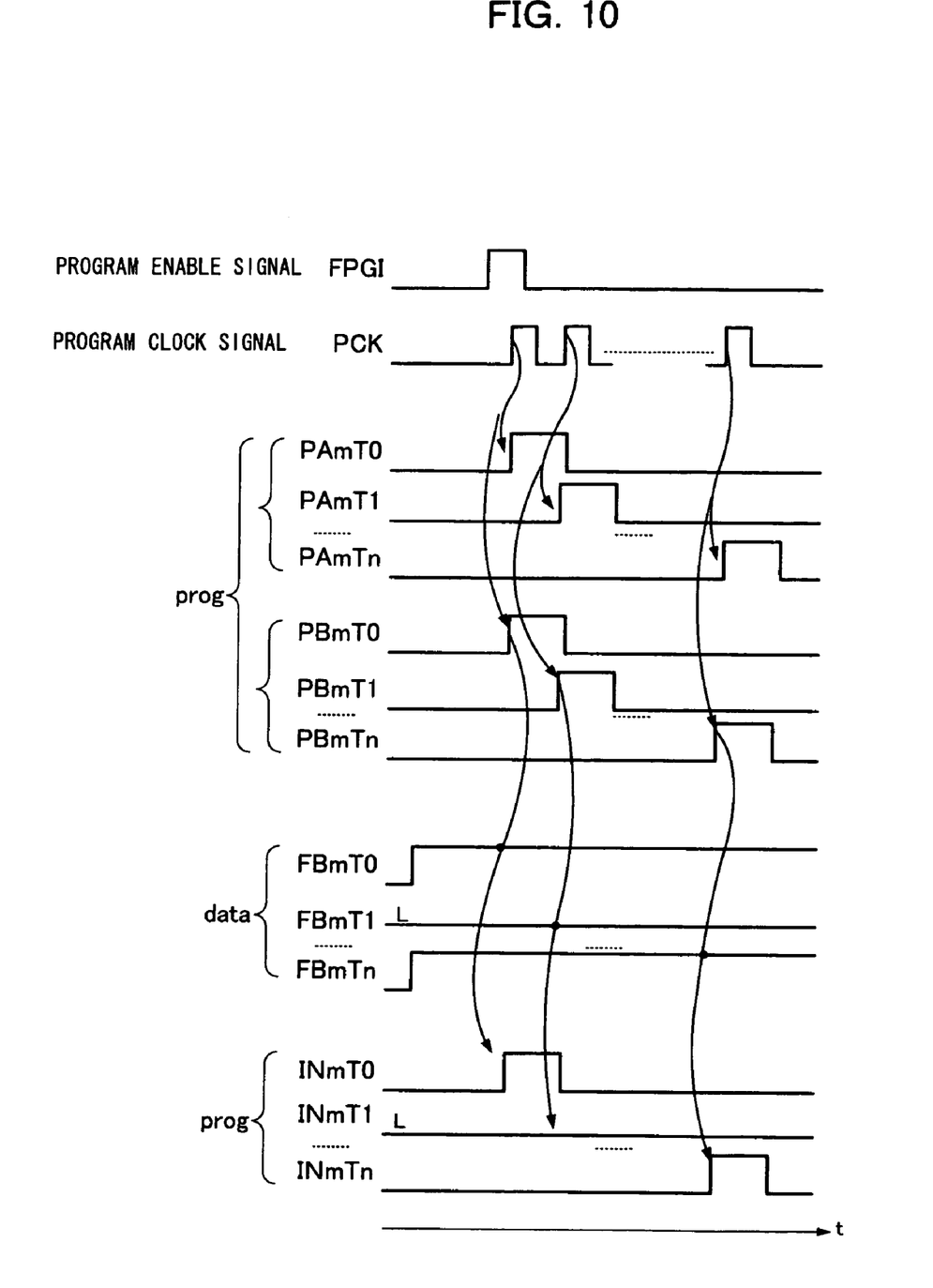
FIG. 10 is a waveform chart showing the operations of the electrical fuse module shown in FIG. 8.

Referring to FIG. 10, the following will discuss the operations of the electrical fuse module configured thus. FIG. 10 is a waveform chart showing the operations of the electrical fuse module shown in FIG. 8.

First, the operations of the electrical fuse core 101 of the i-th stage will be described below.

When the electrical fuse element 104 is programmed (melted), program data FBmTi corresponding to the electrical fuse element 104 to be programmed is set at High (H), program data FBmTi corresponding to the electrical fuse element not to be programmed is set at Low (L), and the program data is inputted to one of the input terminals of the two-input AND circuit 106. For actual programming at a certain time, the program enable signal PBmTi is inputted as a pulse signal to one of the input terminals of the two-input AND circuit 106.

Programming can be performed only in a time period during which the program enable signal PBmTi is set at H. When the program data FBmTi is set at H, output INmTi of the two-input AND circuit 106 is set at H, the NMOS transistor 105 is turned on, and current passes through the electrical fuse element 104, so that the electrical fuse element 104 is melted. Meanwhile, when the program data FBmTi is set at L, even the program enable signal PBmTi at H sets the output INmTi of the two-input AND circuit 106 at L and the NMOS transistor 105 is turned off, so that current does not pass through the electrical fuse element 104 and the electrical fuse element 104 is not melted.

The following will discuss the operations of the overall electrical fuse module.

For example, first, when 1 to n electrical fuse cores 101 are programmed like (1, 0, . . . , 1), (FBmT1, FBmT2, . . . , FBmTn)=(1, 0, . . . , 1) is inputted beforehand.

Then, the initial program enable signal FPGI is raised from L to H in the initial stage of the program shift register block 103 while setup is sufficiently kept for the rising edge of the program clock signal PCK. In the shift register of the initial stage, the CMOS gate circuit 506 (see the circuit diagram of FIG. 9) is turned on and H of the signal FPGI is inputted while the signal PCK is set at L. When the signal PCK rises from L to H, the CMOS gate circuit 506 is turned off and latched by the inverter circuit 507 and the tristate inverter circuit 508, and L is outputted to the output of the inverter circuit 507. Since the CMOS gate circuit 509 is turned on, H is outputted to the program enable signal PBmT1 and the program enable transmission signal PAmT1. The signal FPGI is caused to fall to L in a time interval during which the signal PCK is set at H.

Then, when the signal PCK falls from H to L, the CMOS gate circuit 506 is turned on again and L of the signal FPGI is inputted. The CMOS gate circuit 509 is turned off and latched by the inverter circuit 510 and the tristate inverter circuit 511.

The program enable signal PBmT1 and the program enable transmission signal PAmT1 are kept at H. In a time interval during which the signal PCK is set at L, the program enable transmission signal PAmT1=H is inputted to the input of the shift register of the second stage.

As described above, every time the periodic clocking operation of the program clock signal PCK is repeated, the program enable signals PBmTi (i=1 to n) are sequentially generated as pulse signals each having a width of one period of the signal PCK, and the program enable transmission signals PAmTi (i=1 to n) are similarly transmitted in a sequential manner to the shift registers 107 of the subsequent stages.

When the pulse signal of the program enable signal PBmTi is inputted to the two-input AND circuit 106 of the electrical fuse core 101, a programmable state is generated as described above. Thus, based on program data (FBmT1, FBmT2, . . . , FBmTn)=(1, 0, . . . , 1), the state of the output INmTi (i=1 to n) of the two-input AND circuit 106 is determined according to the rising edge of the signal PCK. In FIG. 10, the output INmT1 of the two-input AND circuit 106 is set at H and the NMOS transistor 105 is turned on only in a time interval equivalent to the pulse width of INmT1, so that the first electrical fuse element 104 is melted. Output INmT2 of the two-input AND circuit 106 is set at L and the NMOS transistor 105 is turned off, so that the second electrical fuse element 104 is not melted. INmTn is set in a similar manner to INmT1, so that the n-th electrical fuse element 104 is melted.

As described above, the electrical fuse elements 104 are melted one by one using the pulse signals of the program enable signals PBmTi which are transferred using the program shift register block 103, so that the electrical fuse elements 104 can be melted using an existing general-purpose without the need for a special tester. Moreover, the shift registers 103 are connected in a serial manner, thereby achieving an excellent electrical fuse module which can be configured with a small number of terminals and mounted in a system LSI.

In recent years, the availability of write-once OTP memory has increased.

For example, such memory is applicable to a system LSI chip capable of recording a system setting specific to a device, a memory card such as an SD card having a secure ID function for protecting information, a semiconductor chip having a chip ID function of recording a lot number, the coordinate position of a chip, an inspection record or the like in a shipping process for each chip and enabling tracing of a failure analysis or the like, and an IC tag for tracking for distribution management and identification of carry-on luggage. For example, in distribution management, a shelf for IC tags enables recognition of movements such as pickup, return, and fitting of merchandise before sale, and prediction of the demand for merchandise. In the identification of carry-on luggage, security is increased by monitoring the route of luggage in an airport, so that crime such as hijacking can be prevented.

It can be considered that OTP memory used for such an application has a medium capacity of about 1 k to 10 kbit. Further, much memory is used and thus manufacturing has to be so inexpensive as not to affect the cost of merchandise and service.

When combined on a system LSI of an advanced process, memory has to be developed on time based on a logic like SRAM and ROM. Regarding nonvolatile memory which requires an additional process and is developed several generations later from the most advanced process like flash memory, although writing is possible, the nonvolatile memory cannot respond to the need of the most advanced process in consideration of the timing of introduction, the manufacturing cost, and so on.

It can be considered that an electrical fuse for OTP is used as memory suitable for the need. Since melting of silicide on polysilicon is used in the electrical fuse, an additional process of flash memory is not necessary and design can be performed based on a logic. Since no additional process is necessary, design can be performed based on the advanced process and the most advanced system LSI can have, on time with low cost, a secure ID function and a chip ID function enabling management of the manufacturing process of the advanced process.

When using the electrical fuse circuit as OTP memory for the above application, it is assumed that additional writing is performed on a space area for each action in addition to initial writing performed simultaneously on all areas and verification is performed accordingly.

Assuming that not only writing is performed using a tester but also a post package program is caused to run with a consumer appliance or the like and the memory is used in portable equipment, high-speed writing with low power consumption is necessary.

In the electrical fuse module of FIG. 8, however, in order to mount a number of electrical fuse elements 104 with a small number of terminals, the shift registers 107 serially connected in series are used for transmitting the program enable signals and serial transfer is performed successively through all the shift registers. Thus even in the case of the additional program and the additional writing, the program enable signal FPGI has to be transmitted through the shift registers 107 of stages as many as the total number of bits. For this reason, writing requires a long time. In the case of mounting in a consumer appliance or the like and programming in a post package, writing at higher speed (to shorten waiting time until another functional block is enabled after programming) and an operation with low power consumption are necessary.

For example, when only 16 bits are added to a space area in memory having a total capacity of 10 kbit, the program enable signals are transmitted through all the shift registers 107 in the existing state, so that the writing time is about 10 msec (assuming that 1-bit programming requires 1 μsec).

In the present invention, for example, when using an electrical fuse as OTP memory mountable in a consumer appliance with a secure ID or the like, the writing time can be shortened and writing can be performed with low power consumption.

The following will describe embodiments of the present invention with reference to the accompanying drawings.

[Embodiment 1]

Figure 1:
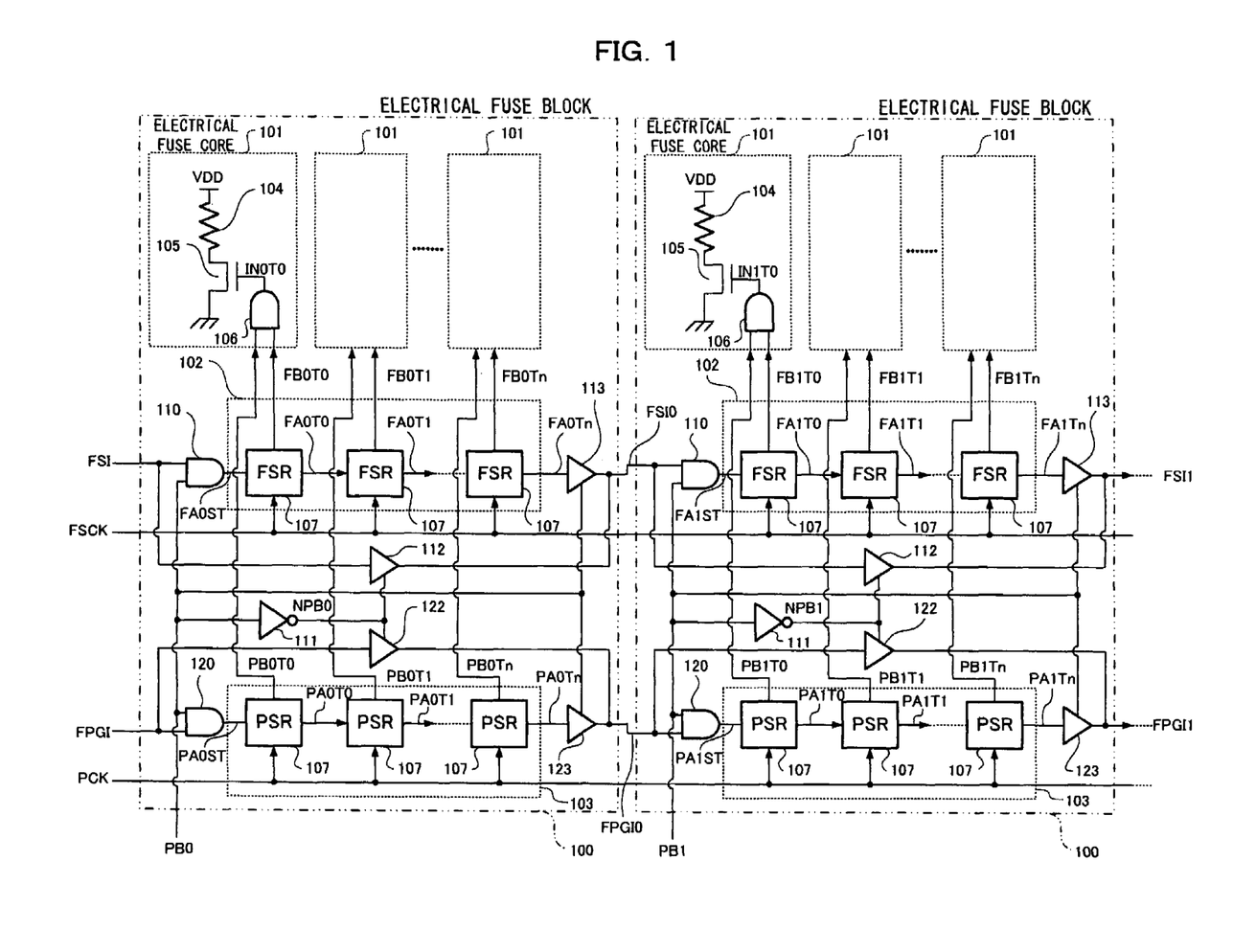
FIG. 1 is a circuit diagram showing the configuration of a semiconductor storage device including an electrical fuse module according to Embodiment 1 of the present invention.

FIG. 1 is a circuit diagram showing the configuration of a semiconductor storage device including an electrical fuse module according to Embodiment 1 of the present invention. The electrical fuse module includes a plurality of fuse elements.

In the electrical fuse module of FIG. 1, reference numeral 100 denotes electrical fuse blocks of two or more stages (p stages, the third stage and later are omitted in FIG. 1).

The stages of the electrical fuse blocks 100 are fed with data clock signal FSCK and program clock signal PCK in a shared manner.

The initial stage of the electrical fuse block 100 is fed with data signal FSI and program enable signal FPGI and outputs signals FSI0 and FPGI0 which are transferred signals of FSI and FPGI. The second stage and later of the electrical fuse block 100 are fed with FSIm and FPGIm and outputs FSI(m+1) and FPGI(m+1); (m=0 to p−1).

Each of the electrical fuse blocks 100 is made up of n electrical fuse cores 101, a data shift register block 102 including n (an integer not smaller than 2) stages, a program shift register block 103 including n stages, and a transmission circuit (will be specifically described later).

Further, the electrical fuse blocks 100 are fed with programming decision signals PBm (m represents the number of stage of the electrical fuse block 100) for deciding whether programming is necessary or not for the electrical fuse blocks 100.

The electrical fuse core 101 is identical to the electrical fuse core 101 of FIG. 8 and thus the same configurations are indicated by the same reference numerals. In FIG. 1, m of the data signal FBmTi and the program enable signal PBmTi (i=1 to n) of FIG. 8 indicates the number of stages of the electrical fuse blocks 100. For example, program enable signal PB0T1 is outputted from the second stage of the program shift register block in the electrical fuse block of the first stage.

"Data Shift Register Block Including n Stages"

The data shift register block 102 is made up of shift registers 107 of n stages. The shift register 107 of the first stage is fed with output signal FAmST (m represents the number of stage of the electrical fuse block 100) of an AND circuit 110, and the shift registers 107 of the first stage to the n-th stage are serially connected such that the output of the previous stage is connected to the input of the subsequent stage (data transmission signals FAmT0 to FAmTn; m represents the number of stages of the electrical fuse blocks 100). Further, the program clock signal FSCK is connected in common to the first stage to the n-th stage of the data shift register block 102. Moreover, data signals FBmT0 to FBmTn outputted from the shift registers 107 are connected respectively as the data signals of electrical fuse cores 101 of the first stage to the n-th stage.

In the initial stage, the AND circuit 110 is fed with the data signal FSI and the programming decision signal PB0 and outputs the data signal FA0ST. In the second stage, the AND circuit 110 is fed with the data signal FSI0 and the programming decision signal PB1 and outputs data signal FA1ST.

The electrical fuse block 100 further includes a tristate buffer circuit 113 which is fed with the output data transmission signal FA0Tn of the data shift register block 102. The tristate buffer circuit 113 uses the programming decision signal PBm as a control signal (enabled at High), is fed with the output data transmission signal FA0Tn of the data shift register block 102, and outputs the data signal FSIm; (m=0 to p) to be inputted to the electrical fuse block of the subsequent stage.

The electrical fuse block 100 further includes an inverter circuit 111 which is fed with the programming decision signal PBm and outputs inverted signal NPBm of the signal PBm, and tristate buffer circuits 112 and 122 which use the inverted signal NPBm of the inverter circuit 111 as a control signal (enabled at High).

The tristate buffer circuit 112 uses the output signal NPBm of the inverter circuit 111 as a control signal (enabled at High), is fed with FSI in the initial stage and FSI(m−1); (m=1 to p) in the second stage and later, and outputs the data signal FSIm; (m=0 to p) to be inputted to the electrical fuse block 100 of the subsequent stage.

"Program Shift Register Block Including n Stages"

The program shift register block 103 is made up of shift registers 107 of n stages. The initial stage is fed with output signal PAmST (m represents the number of stages of the electrical fuse blocks 100) of an AND circuit 120, and the shift registers 107 of the first stage to the n-th stage are serially connected such that the output of the previous stage is connected to the input of the subsequent stage (program enable transmission signals PAmT0 to PAmTn; m represents the number of stages of the electrical fuse blocks 100). The program clock signal PCK is connected in common to the first stage to the n-th stage of the shift registers 103. Further, program enable signals PBmT0 to PBmTn outputted from the shift registers 103 are connected respectively as the program enable signals of the electrical fuse cores 101 of the first stage to the n-th stage.

In the initial stage, the AND circuit 120 is fed with the program enable signal FPGI and the programming decision signal PB0 and outputs program enable signal PA0ST. In the second stage, the AND circuit 120 is fed with the program enable signal FPGI0 and the programming decision signal PB1 and outputs program enable transmission signal PA1ST.

The electrical fuse block 100 further includes a tristate buffer circuit 123 which is fed with the output program enable transmission signal PA0Tn of the program shift register block 103. The tristate buffer circuit 123 uses the programming decision signal PBm as a control signal (enabled at High), is fed with the output program enable transmission signal PA0Tn of the program shift register block 103, and outputs the program enable signal FPGIm; (m=0 to p) to be inputted to the electrical fuse block of the subsequent stage.

The tristate buffer circuit 122 uses the output signal NPBm of the inverter circuit 111 as a control signal (enabled at High), is fed with the program enable signal FPGI in the first stage and FSGI (m−1); (m=1 to p) in the second stage and later, and outputs the program enable signal FPGIm; (m=0 to p) to be inputted to the electrical fuse block of the subsequent stage.

The transmission circuit includes the AND circuits 110 and 120, the inverter circuit 111, and the tristate buffer circuits 112, 113, 122, and 123.

"Operation"

Figure 2:
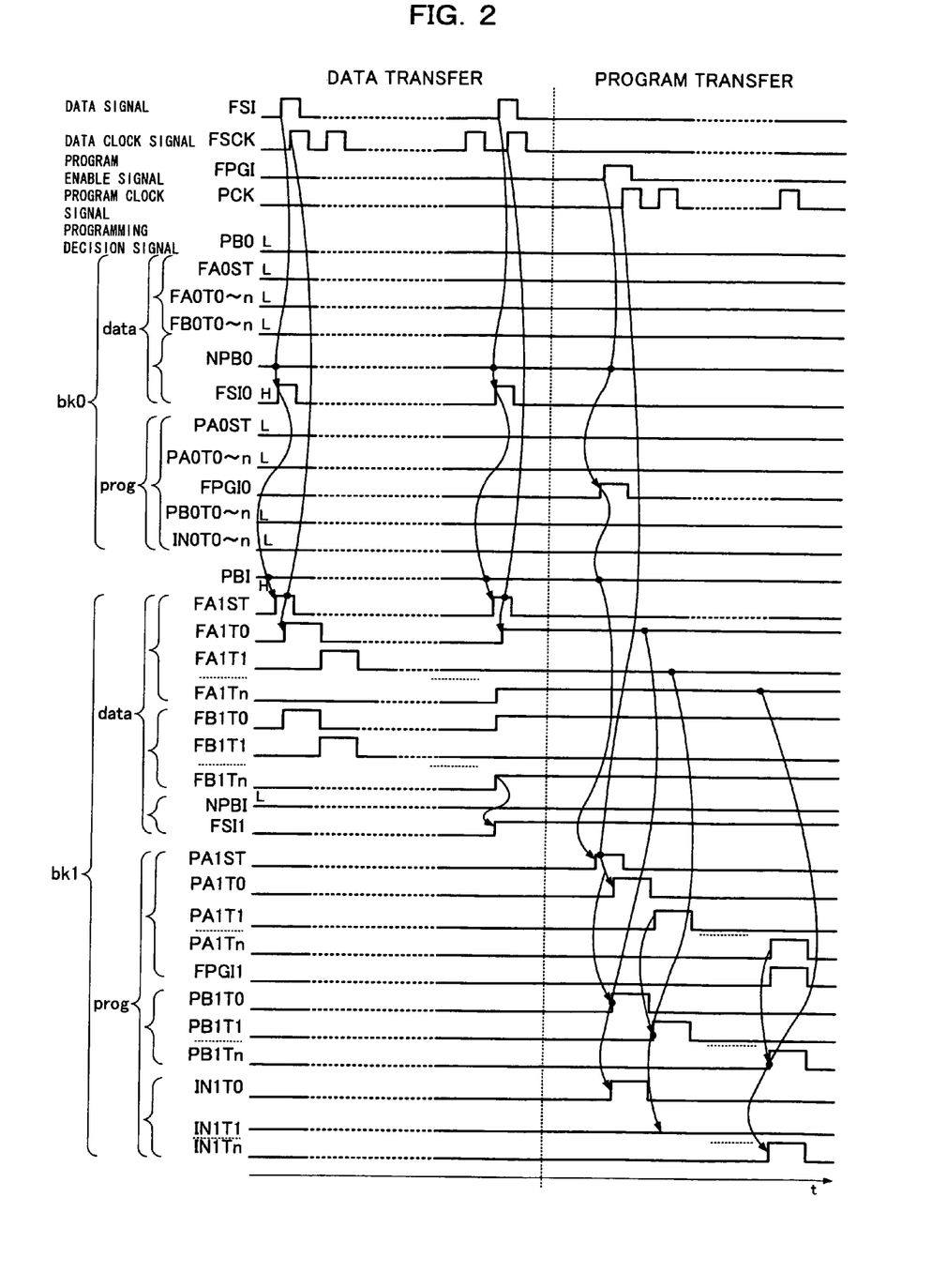
FIG. 2 is a waveform chart showing the operations of the electrical fuse module.

Referring to FIG. 2, the following will discuss the operations of the electrical fuse module configured thus.

FIG. 2 is a waveform chart showing the operations of the electrical fuse module according to Embodiment 1 of the present invention.

The operations of the electrical fuse core 101 of the i-th stage is similar to those of the electrical fuse core 101 of FIG. 8 and thus the explanation thereof is omitted. In this case, the transfer of data information and the program enable signal to the electrical fuse block of the initial stage (first stage) is skipped, the data information and the program enable signal are transferred to the electrical fuse block of the second stage, and then the data is written (programming). As in FIG. 8, one to n pieces of data information are programmed like (1, 0, . . . , 1) in the n electrical fuse cores 101 in the electrical fuse block of the second stage to be programmed.

For this purpose, the programming decision signals PB0 and PB1 are first set at L and H, respectively.

The program enable signal FPGI and the program clock signal PCK are not operated but fixed at L until the completion of data transfer.

The input signal PB0, which is one of the input signals of the AND circuit 110 in the initial stage of the electrical fuse block 100, is fed with L. The input FA0ST to the initial stage of the data shift register block 102 is set at L regardless of the state of the input of the data signal FSI. Thus L is always outputted as the data transmission signal FA0Ti and the data signal FB0Ti regardless of the lapse of time.

Meanwhile, the output signal NPB0 of the inverter circuit 111 is set at H in response to the input of the programming decision signal PB0, and the tristate buffer circuit 112 is enabled, fed with the data signal FSI, and outputs the data signal FSI0.

Since the programming decision signal PB1 is set at H, the data signal FSI0 is transmitted to the signal FA1ST.

After the data signal FSI is inputted to the initial stage of the electrical fuse block through the above operations, the signal is transmitted to the initial stage of the data shift register block 102 in the electrical fuse block 100 of the second stage. Data to be programmed in the n-th stage, that is, H is raised from L to H while setup is sufficiently kept for the rising edge of the data clock signal FSCK. The clocking operation of the shift register 107 is performed according to the same operations as FIG. 8 to transmit the data signals of the first to n-th stages. In other words, the input of data is transmitted in the order from the n-th stage to the first stage.

Finally, the outputs of the data signal FB1Ti of the first to n-th stages are set at (H, L, . . . , H). In this way, the data information skips the data shift register block of the electrical fuse block 100 of the initial stage and is transferred to the electrical fuse block 100 of the subsequent stage.

After the completion of data transfer, the program enable signal is transferred in a similar manner and the inputted data is programmed.

As in the data transfer, the programming decision signals PB0=L and PB1=H prevent the program enable signal FPGI from being transmitted to the program shift register block 103 in the electrical fuse block 100 of the initial stage, and L is always outputted as PA0Ti and PB0Ti. In other words, the electrical fuse elements 104 of the electrical fuse cores 101 in the electrical fuse block 100 of the initial stage are not programmed.

Meanwhile, the output signal NPB0 of the inverter circuit 111 is set at H in response to the input of the programming decision signal PB0. The tristate buffer circuit 122 is enabled, fed with the program enable signal FPGI, and outputs the program enable signal FPGI0.

Since the programming decision signal PB1 is set at H, the program enable signal FPGI0 is transmitted to the signal PA1ST.

After the program enable signal FPGI is inputted to the initial stage of the electrical fuse block 100 through the above operations, the signal is transmitted to the program shift register block 103 in the electrical fuse block of the second stage.

Then, the program enable signal FPGI0 is raised from L to H in the initial stage of the program shift register block 103 in the electrical fuse block of the second stage while setup is sufficiently kept for the rising edge of the program clock signal PCK. Every time the periodic clocking operation of the program clock signal PCK is repeated, the program enable signal PB1Ti (i=1 to n) is generated as a pulse signal having a width equivalent to one period of the signal PCK, and the program enable transmission signal PA1Ti (i=1 to n) is similarly transmitted to the shift register of the subsequent stage.

When the pulse signal of the program enable signal PB1Ti is inputted to the two-input AND circuit 106 of the electrical fuse core 101, a programmable state is generated as described above. Thus, based on program data signals (FB1T1, FB1T2, . . . , FB1Tn)=(1, 0, . . . , 1), the state of the output IN1Ti (i=1 to n) of the two-input AND circuit 106 is determined according to the rising edge of the signal PCK. In FIG. 2, IN1T0 is set at H, the NMOS transistor 105 is turned on only in a time interval equivalent to the pulse width of IN1T0, and the first electrical fuse element 104 is melted. IN1T1 is set at L, the NMOS transistor 105 is turned off, and the second electrical fuse element 104 is not melted. IN1Tn is set in a similar manner to IN1T1 and the (n+1)th electrical fuse element 104 is melted.

In this way, the program enable signal FPGI skips the data shift register block 102 in the electrical fuse block 100 of the initial stage and is transferred to the electrical fuse block 100 of the subsequent stage, and the program enable signal FPGIm is sequentially transmitted according to the transferred data signal, so that programming is performed.

As described above, when programming is performed by the operation of the transmission circuit according to the programming decision signal PBm, the data signal FSI is sequentially transmitted to the shift registers 107 in the data shift register blocks 102, and the data signals FBmTi are outputted to the NMOS transistors 105 through the AND circuits 106 of the electrical fuse cores 101 and transmitted to the electrical fuse block 100 of the subsequent stage. Further, the program enable signal FPGI is sequentially transmitted to the shift registers 107 in the program shift register block 103, and the program enable signals PBmTi are outputted to the NMOS transistors 105 through the AND circuits 106 of the electrical fuse cores 101 and transmitted to the electrical fuse block 100 of the subsequent stage.

The data signal FBmTi and the program enable signal PBmTi are both turned on. Thus the NMOS transistor 105 is driven, current is caused to pass through the electrical fuse element 104, so that the electrical fuse element 104 is melted and programmed.

When programming is not performed, the data signal FSI skips the shift registers 107 in the data shift register block 102 and is transmitted to the electrical fuse blocks 100 of the subsequent stage and later. Further, the program enable signal FPGI skips the shift registers 107 in the program shift register block 103 and is transmitted to the electrical fuse blocks 100 of the subsequent stage and later.

As a result, it is possible to achieve an excellent electrical fuse module whereby when writing (programming) is performed on a specific data block of a space area, the data signal transfer time and the transfer time of the program enable signal can be shortened and the power consumption of transmission can be reduced accordingly. Further, the electrical fuse block 100 not having been programmed can be skipped during verification, reducing check time. Moreover, the data shift register block 102 makes it possible to reduce the number of terminals required for transferring the data signal, which is an advantage to the mounting of a chip.

Consequently, for example, when using an electrical fuse as OTP memory mountable in a consumer appliance having a function such as a secure ID or the like, writing can be performed in a shorter time and with low power consumption.

[Embodiment 2]

Figure 3:
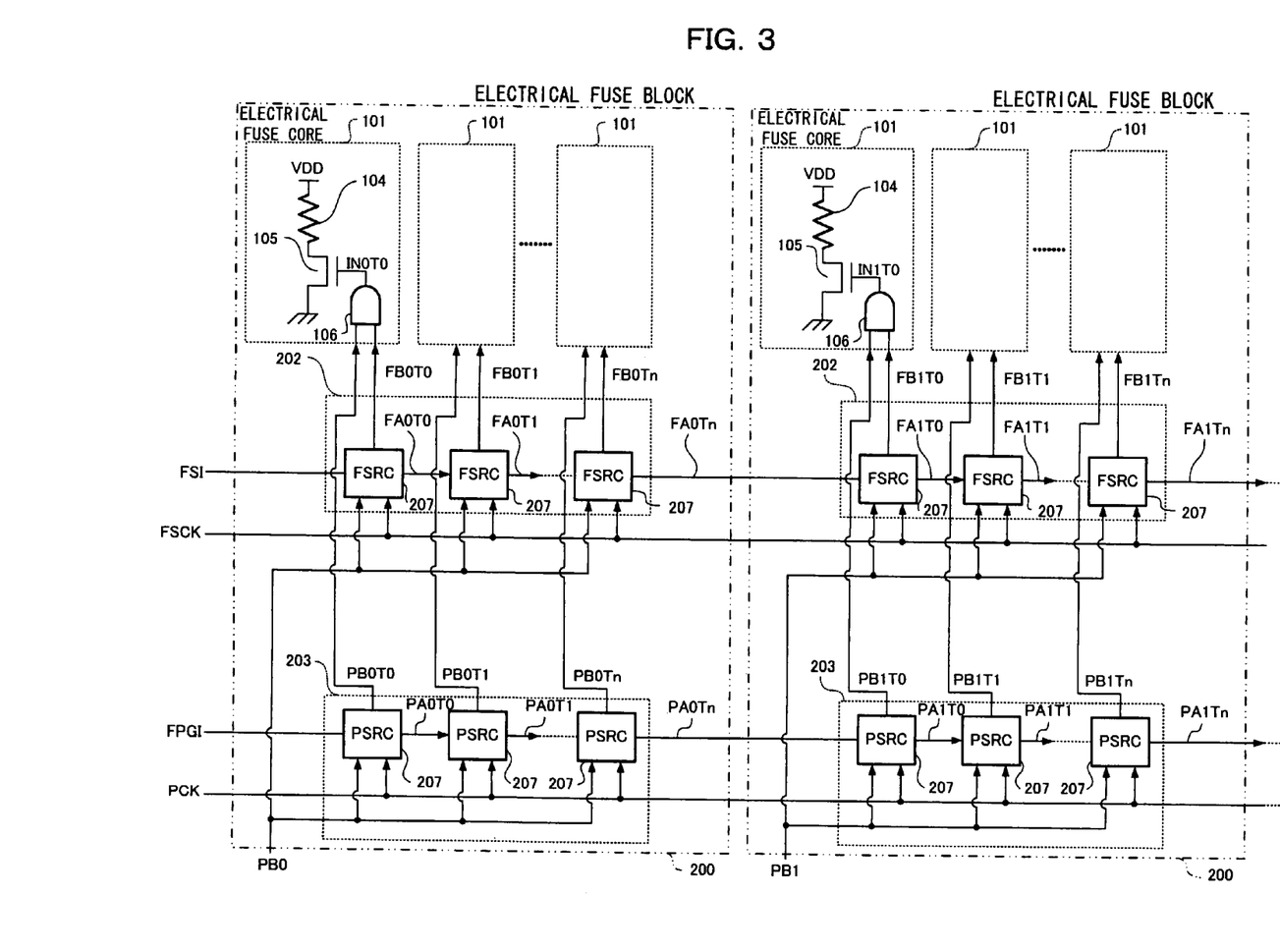
FIG. 3 is a circuit diagram showing the configuration of a semiconductor storage device including an electrical fuse module according to Embodiment 2 of the present invention.

FIG. 3 is a circuit diagram showing the configuration of a semiconductor storage device including an electrical fuse module according to Embodiment 2 of the present invention. The electrical fuse module includes a plurality of fuse elements.

In the electrical fuse module of FIG. 2, reference numeral 200 denotes electrical fuse blocks of two or more stages (p stages, the third stage and later are omitted in FIG. 2).

The electrical fuse blocks 200 are fed with data clock signal FSCK and program clock signal PCK in a shared manner. The initial stage of the electrical fuse block 200 is fed with data signal FSI and program enable signal FPGI and outputs signals FA0Tn and PA0Tn which are transferred signals of FSI and FPGI. The second stage and later of the electrical fuse block 200 are fed with FA(m−1)Tn and PA(m−1)Tn and output FAmTn and PAmTn; (m=0 to p−1).

The electrical fuse block 200 is made up of n electrical fuse cores 101, a data shift register block 202 including n stages, and a program shift register block 203 including n stages.

Further, the electrical fuse block 200 is fed with programming decision signal PBm (m represents the number of stage of the electrical fuse block 200) for deciding whether programming is necessary or not for the electrical fuse block 200.

The electrical fuse core 101 is identical to the electrical fuse core 101 of Embodiment 1 and thus the same configurations are indicated by the same reference numerals.

"Data Shift Register Block Including n Stages"

The data shift register block 202 is made up of shift registers 207 of n stages. The electrical fuse block of the initial stage is fed with the data signal FSI and the electrical fuse block of the second stage and later are fed with FA(m−1)Tn; (m=1 to p). The shift registers of the first stage to the n-th stage are serially connected such that the output of the previous stage is connected to the input of the subsequent stage (data transmission signals FAmT0 to FAmTn; m represents the number of stage of the electrical fuse block 200). Further, the program clock signal FSCK is connected in common to the data shift registers 207 of the first stage to the n-th stage. Moreover, data signals FBmT0 to FBmTn outputted from the shift registers 207 are connected respectively as the data signals of electrical fuse cores 101 of the first stage to the n-th stage.

"Program Shift Register Block Including n Stages"

The program shift register block 203 is made up of shift registers 207 of n stages. The electrical fuse block of the initial stage is fed with the program enable signal FPGI and the electrical fuse blocks of the second stage and later are fed with PA(m−1)Tn; (m=1 to p). The shift registers of the first stage to the n-th stage are serially connected such that the output of the previous stage is connected to the input of the subsequent stage (program enable transmission signals PAmT0 to PAmTn; m represents the number of stage of the electrical fuse block 200). Program clock signal PCK is connected in common to the first stage to the n-th stage of the shift registers 207. Further, program enable signals PBmT0 to PBmTn outputted from the shift registers 207 are connected respectively as the program enable signals of the electrical fuse cores 101 of the first stage to the n-th stage.

"Shift Register 207"

Figure 4:
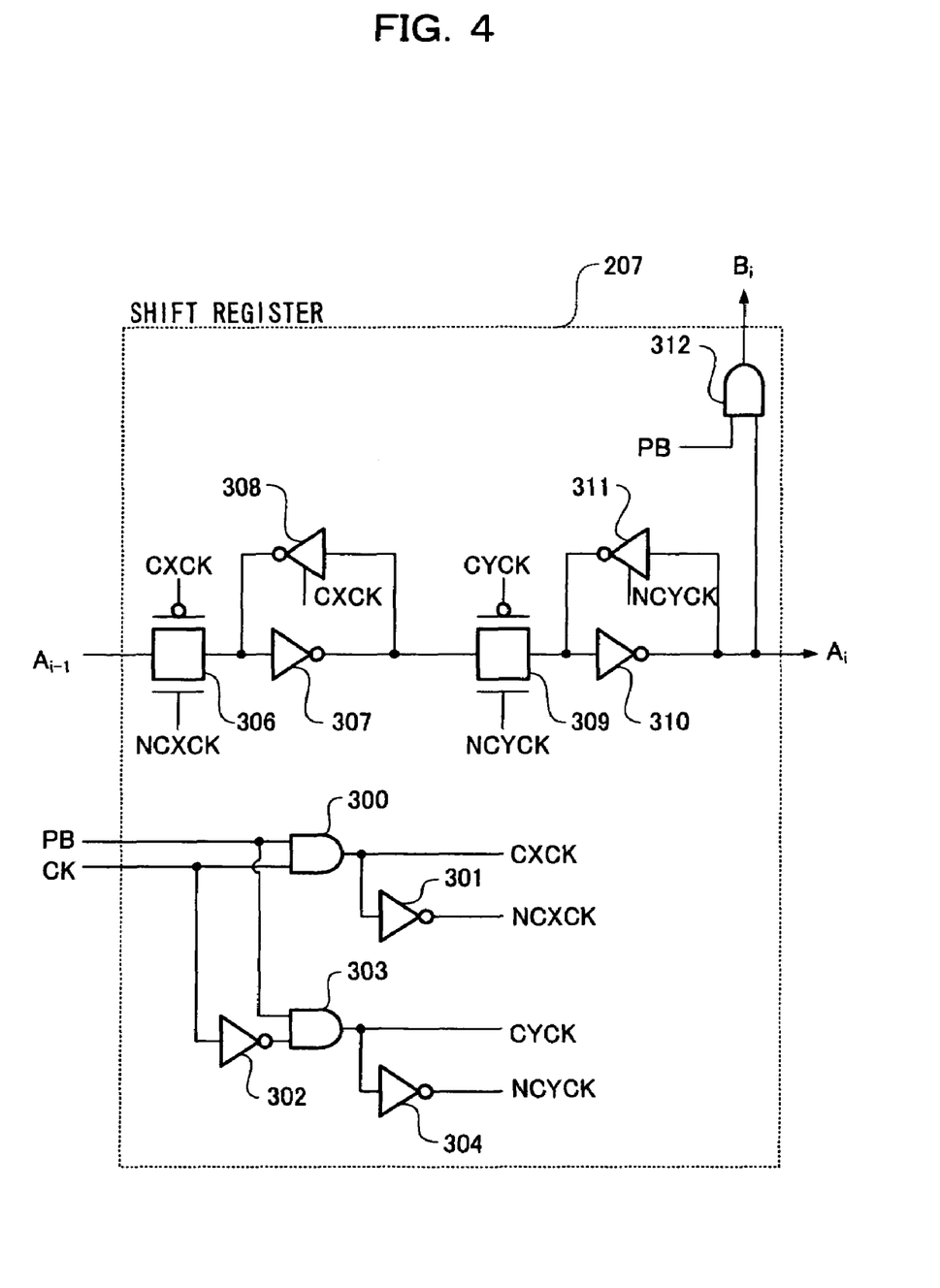
FIG. 4 is a circuit diagram showing the configuration of a shift register in the electrical fuse module.

FIG. 4 is a circuit diagram showing the configuration of the i-th stage of the shift register 207 shown in FIG. 3.

In the shift register 207 of FIG. 4, reference numeral 300 denotes an AND circuit which is fed with programming decision signal PB and clock signal CK and outputs signal CXCK, reference numeral 301 denotes an inverter circuit which is fed with the output signal CXCK of the AND circuit 300 and outputs signal NCXCK, reference numeral 302 denotes an inverter circuit fed with the clock signal CK, reference numeral 303 denotes an AND circuit which is fed with the programming decision signal PB and the output of the inverter circuit 302 and outputs signal CYCK, and reference numeral 304 denotes an inverter circuit which is fed with the output signal CYCK of the AND circuit 303 and outputs signal NCYCK. In FIG. 3, the clock signal CK corresponds to the data clock signal FSCK of the data shift register block 202 and corresponds to the program clock signal PCK of the program shift register block 203.

Further, reference numeral 306 denotes a CMOS gate circuit, reference numeral 307 denotes an inverter circuit fed with the output of the CMOS gate circuit 306, reference numeral 308 denotes a tristate inverter circuit, reference numeral 309 denotes a CMOS gate circuit, reference numeral 310 denotes an inverter circuit which is fed with the output of the CMOS gate circuit 303 and outputs program enable transmission signal Ai and the program enable signal PBmTi, and reference numeral 311 denotes a tristate inverter circuit.

In the CMOS gate circuit 306, the gate of a PMOS transistor is connected to the signal CXCK and the gate of the NMOS transistor is connected to the signal NCXCK. The input of the CMOS gate circuit 306 is connected to transmission signal Ai−1 (corresponds to FAmTi−1 of the data shift register block and corresponds to PAmTi−1 of the program shift register block in FIG. 3) which is the output of the (i−1)th stage.

The tristate inverter circuit 308 is fed with the output of the inverter circuit 307 and uses the signal CXCK as a control signal (enabled at High). The output of the tristate inverter circuit 308 is connected to the node of the output of the CMOS gate circuit 306 and the input of the inverter circuit 307.

In the CMOS gate circuit 309, the gate of a PMOS transistor is connected to the signal CYCK, the gate of an NMOS transistor is connected to the signal NCYCK, and the input of the CMOS gate circuit 309 is connected to the output of the inverter circuit 310.

The tristate inverter circuit 311 is fed with the output of the inverter circuit 310 and uses the signal NCYCK as a control signal (enabled at High). The output of the tristate inverter circuit 311 is connected to the node of the output of the CMOS gate circuit 309 and the input of the inverter circuit 310.

Figure 5:
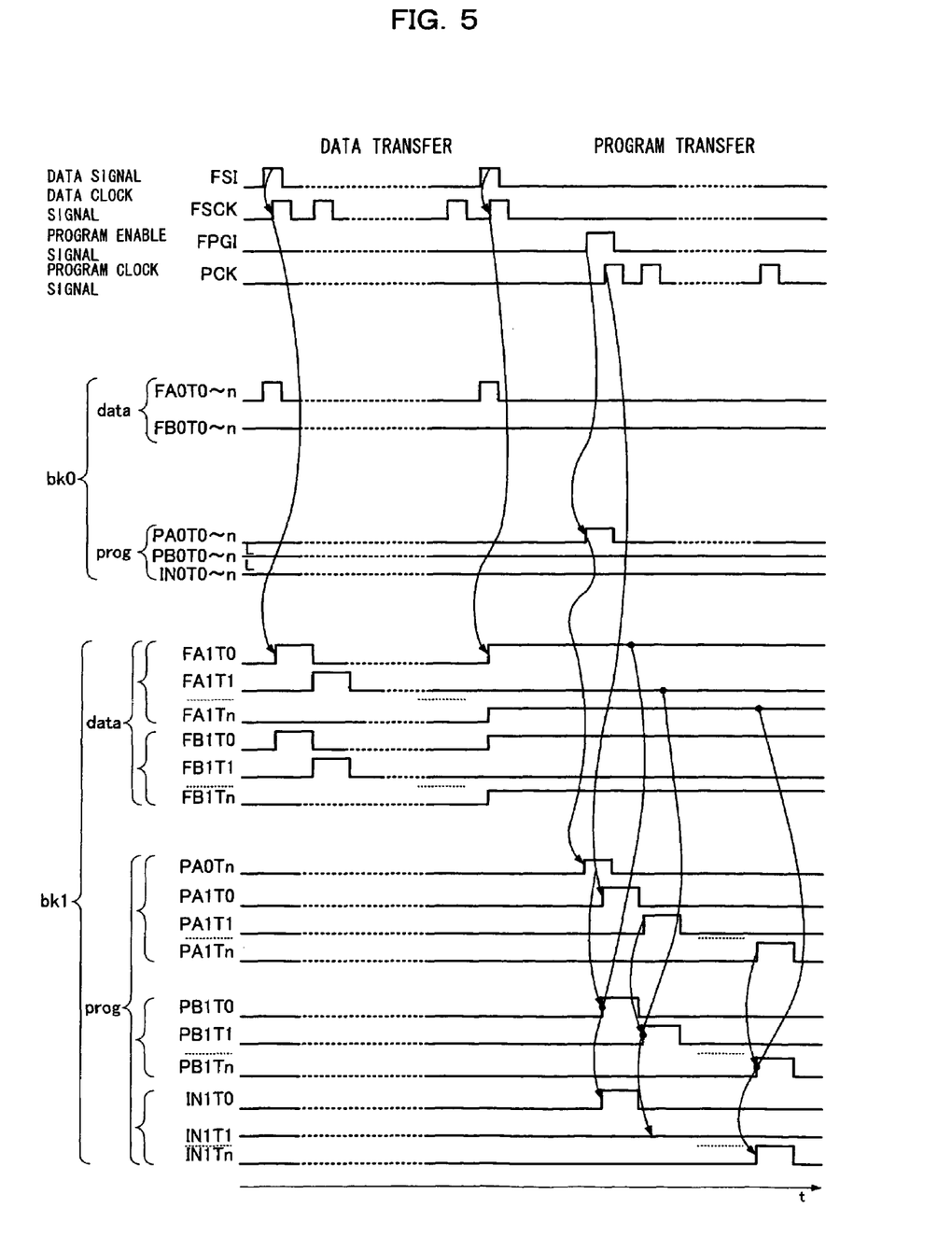
FIG. 5 is a waveform chart showing the operations of the electrical fuse module.

Referring to FIG. 5, the following will discuss the operations of the electrical fuse module configured thus.

FIG. 5 is a waveform chart showing the operations of the electrical fuse module according to Embodiment 2 of the present invention.

The operations of the electrical fuse core 101 of the i-th stage is similar to those of the electrical fuse core 101 of FIG. 8 and thus the explanation thereof is omitted. In this case, first the transfer of the data signal and the program enable signal to the electrical fuse block of the initial stage (first stage) is skipped, the data signal and the program enable signal are transferred to the electrical fuse block of the second stage, and then the data is written (programming). As in FIG. 8, one to n data signals are programmed like (1, 0, . . . , 1) in the n electrical fuse cores 101 in the electrical fuse block of the second stage to be programmed.

For this purpose, the programming decision signals PB0 and PB1 are first set at L and H, respectively.

The shift register 207 will be discussed below.

In the shift register 207, a shift register section is similar in configuration to the shift register 107 of FIG. 9. As shown in FIG. 4, the control signals of the clock signals CK and NCK are represented as CXCK, NCXCK, CYCK and NCYCK.

When H is inputted to the programming decision signal PB through the lower part of FIG. 4, that is, a circuit made up of the AND circuits 300 and 303 and the inverter circuits 301, 302 and 304, data can be sequentially transferred by a clocking operation as in the conventional shift transistor 107. When L is inputted to the programming decision signal PB, CXCK=L, NCXCK=H, CYCK=L and NCYCK=H are obtained, so that a through state is obtained in which the input Ai−1 can be transmitted to Ai as it is.

In this way, the shift register 207 of the data shift register block 202 outputs, when performing programming in response to the programming decision signal PBm, the data signal FBmTi to the NMOS transistor 105 through the AND circuit 106 of the electrical fuse core 101 to perform programming, and transmits the signal to the shift register 207 of the subsequent stage. When not performing programming, the shift register 207 transmits the data signal FAmTi to the shift register 207 of the subsequent stage.

Further, the shift register 207 of the program shift register block 203 outputs, when performing programming in response to the programming decision signal PBm, the program enable signal PBmTi to the NMOS transistor 105 through the AND circuit 106 of the electrical fuse core 101 to perform programming, and transmits the signal to the shift register 207 of the subsequent stage. When not performing programming, the shift register 207 transmits the program enable signal PAmTi to the shift register 207 of the subsequent stage.

The program enable signal FPGI and the program clock signal PCK are not operated but fixed at L until the completion of data transfer.

L is inputted to the signal PB0 of the data shift register block 202 in the electrical fuse block 200 of the initial stage, so that the shift register 207 enters a through state. Thus the data signal FSI is directly passed and transmitted to the electrical fuse block 200 of the second stage.

Thus the data transmission signal FA0Ti has the same waveform as the input waveform of the inputted data signal FSI. Since PB0=L is set for the data signal FB0Ti, L is always outputted regardless of the lapse of time.

After the data signal FSI is inputted to the initial stage of the electrical fuse block 200 through the above operations, the signal is transmitted to the initial stage of the data shift register block 202 in the electrical fuse block 100 of the second stage. Data to be programmed in the n-th stage, that is, H is raised from L to H while setup is sufficiently kept for the rising edge of the data clock signal FSCK. The clocking operation of the shift register 207 is performed according to the same operations as FIG. 8 to transmit the data signals of the first to n-th stages. In other words, the input of data is transmitted in the order from the n-th stage to the first stage.

Finally, the outputs of the data signal FB1Ti of the first to n-th stages are set at (H, L, . . . , H). In this way, the data signal skips the data shift register block 202 in the electrical fuse block 200 of the initial stage and is transferred to the electrical fuse block 200 of the subsequent stage.

After the completion of data transfer, the program enable signal FPGI is transferred in a similar manner and the inputted data is programmed.

As in data transfer, since the programming decision signals PB0=L and PB1=H are set, the program enable signal FPGI is passed through the program shift register block 203 in the electrical fuse block 200 of the initial stage, the output PA0Ti of the shift register 207 has the same waveform as the input of the program enable signal FPGI, and L is always outputted as PB0Ti. In other words, the electrical fuse element of the electrical fuse core 101 in the electrical fuse block 200 of the initial stage is not programmed.

After the program enable signal FPGI is inputted to the initial stage of the electrical fuse block 200 through the above operations, the signal is transmitted to the initial stage of the program shift register block 203 in the electrical fuse block of the second stage.

The program enable signal PA0Tn is inputted to the initial stage of the program shift register block 203 in the electrical fuse block 200 of the second stage. Every time the periodic clocking operation of the program clock signal PCK is repeated, the program enable signal PBTi (i=1 to n) is sequentially generated as a pulse signal having a width equivalent to one period of the signal PCK, and the program enable transmission signal PA1Ti (i=1 to n) is similarly transmitted in a sequential manner to the shift registers 207 of the subsequent stage.

When the pulse signal of the program enable signal PB1Ti is inputted to the two-input AND circuit 106 of the electrical fuse core 101, a programmable state is generated as described above. Thus, based on program data signals (FB1T1, FB1T2, . . . , FB1Tn)=(1, 0, . . . , 1), the state of the output IN1Ti (i=1 to n) of the two-input AND circuit 106 is determined according to the rising edge of the signal PCK. In FIG. 5, IN1T0 is set at H, the NMOS transistor 105 is turned on only in a time interval equivalent to the pulse width of IN1T0, and the first electrical fuse element 104 is melted. IN1T1 is set at L, the NMOS transistor 105 is turned off, and the second electrical fuse element 104 is not melted. IN1Tn is set in a similar manner to IN1T1 and the (n+1) th electrical fuse element 104 is melted.

In this way, the program enable signal FPGI skips the program shift register block 203 in the electrical fuse block 200 of the initial stage and is transferred to the electrical fuse block 200 of the subsequent stage, and the program enable signal FPGI is sequentially transmitted according to the transferred data signal, so that programming is performed.

Therefore, it is possible to achieve an excellent electrical fuse module whereby when writing (programming) is performed on a specific data block of a space area, the data signal transfer time and the program enable signal transfer time can be shortened and the power consumption of transmission can be reduced accordingly. Further, the electrical fuse block 200 not having been programmed can be skipped during verification, reducing check time. Moreover, the data shift register block 202 makes it possible to reduce the number of terminals required for transferring the data signal, which is an advantage to the mounting of a chip.

As a result, for example, when using an electrical fuse as OTP memory mountable in a consumer appliance having a function such as a secure ID, writing can be performed in a shorter time with low power consumption.

[Embodiment 3]

Figure 6:
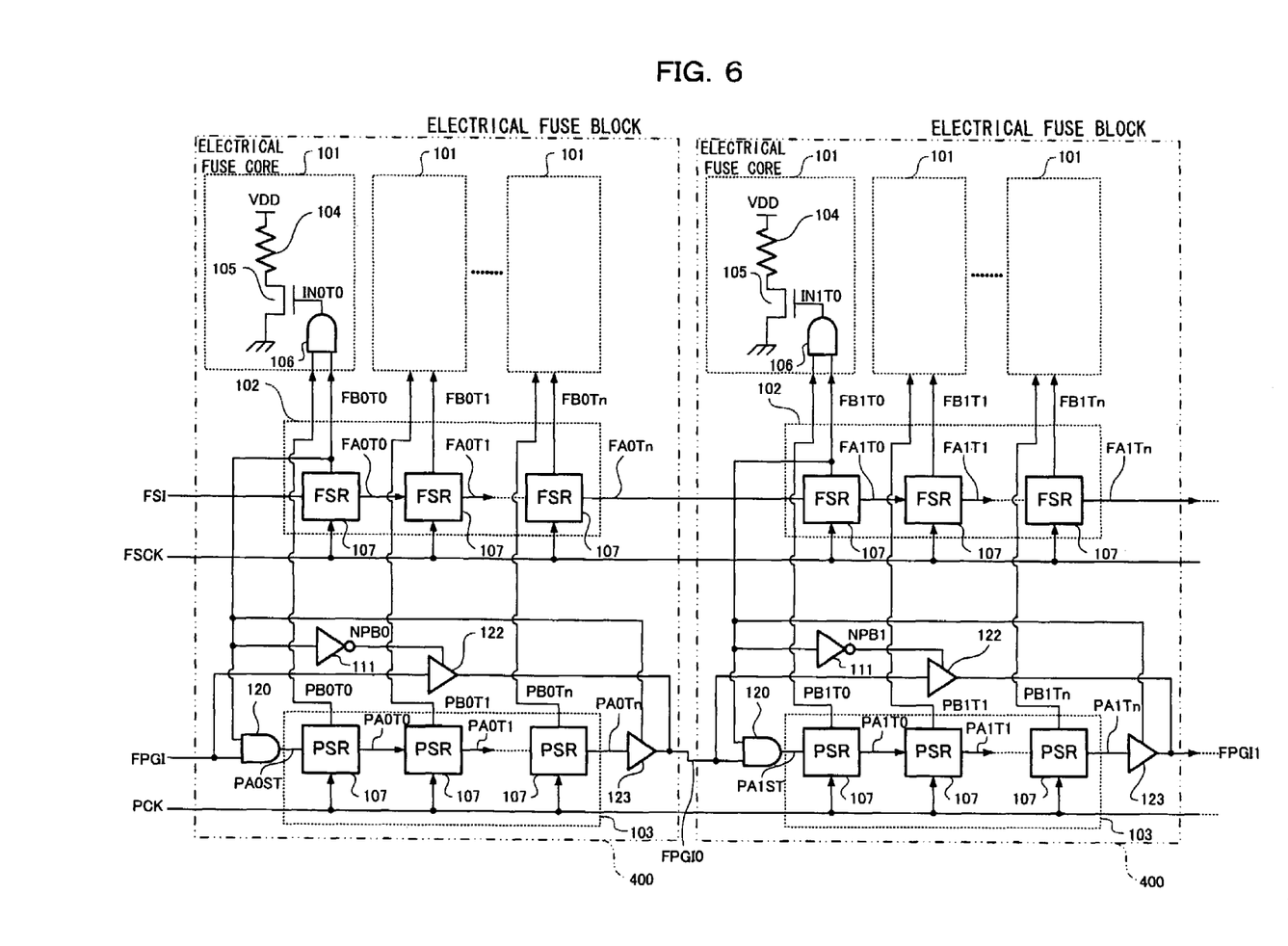
FIG. 6 is a circuit diagram showing the configuration of a semiconductor storage device including an electrical fuse module according to Embodiment 3 of the present invention.

FIG. 6 is a circuit diagram showing the configuration of a semiconductor storage device including an electrical fuse module according to Embodiment 3 of the present invention. The electrical fuse module includes a plurality of fuse elements.

In the electrical fuse module of FIG. 6, reference numeral 400 denotes electrical fuse blocks of two or more stages (p stages, the third stage and later are omitted).

The electrical fuse blocks 400 are fed with data clock signal FSCK and program clock signal PCK in a shared manner. The initial stage of the electrical fuse block 400 is fed with data signal FSI and program enable signal FPGI and outputs signals FA0Tn and FPGI0 which are transferred signals of FSI and FPGI. The second stage and later of the electrical fuse block 400 are fed with FA(m−1)Tn and FPGI(m−1) and output FAmTn and FPGIm; (m=1 to p−1).

In the electrical fuse block 400, the same configurations as those of FIG. 1 are indicated by the same reference numerals and the explanation thereof is omitted.

Unlike FIG. 1, the input of the first stage of the data shift register block 102 of the electrical fuse block 400 is directly connected to the data signal FSI and the data signal FA0Tn which is the output of the n-th stage is connected to the input of the first stage of the data shift register in the electrical fuse block 400 of the second stage. Similarly data signal FA1Tn which is the output of the data shift register of the n-th stage in the electrical fuse block 400 of the second stage is connected to the electrical fuse block of the third stage, and such connection is repeated.

In this case, a data signal for determining the presence or absence of programming of the electrical fuse block or a signal equivalent to the data signal is inputted to the electrical fuse core 101 of the first stage in the electrical fuse block 400, and then programming is performed. When performing programming, the data signal FBmT0=H is set in the first stage of the data shift register block 102. When not performing programming, FBMT0=L is set.

Instead of the programming decision signal PBm inputted to the AND circuit 120 in FIG. 1 of Embodiment 1, the data signal FBmT0 of the first stage is used as a programming decision signal.

The transmission circuit is made up of the AND circuit 120, an inverter circuit 111, and tristate buffer circuits 122 and 123.

Figure 7:
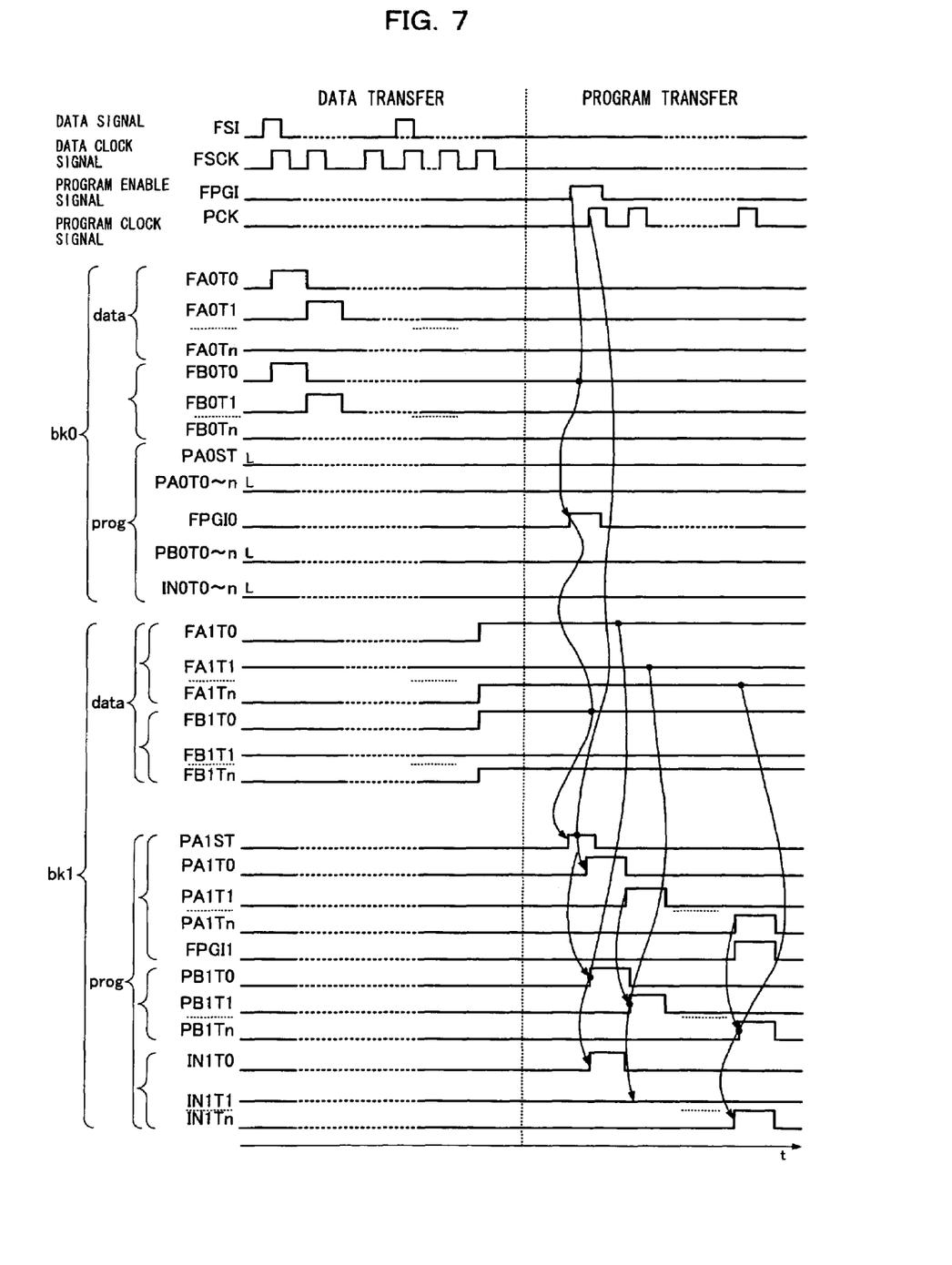
FIG. 7 is a waveform chart showing the operations of the electrical fuse module.

Referring to FIG. 7, the following will discuss the operations of the electrical fuse module configured thus.

FIG. 7 is a waveform chart showing the operations of the electrical fuse module according to Embodiment 3 of the present invention.

The operations of the electrical fuse core 101 of the i-th stage is similar to those of the electrical fuse core 101 of FIG. 8 and thus the explanation thereof is omitted. In this case, first the transfer of the data signal and the program enable signal to the electrical fuse block of the initial stage (first stage) is skipped, the data signal and the program enable signal are transferred to the electrical fuse block of the second stage, and then data is written (programming).

In Embodiment 3 of the present invention, a signal equivalent to the signal for determining whether programming is necessary or not is programmed in the first stage of the electrical fuse core 101 in each of the electrical fuse blocks 400. In other words, signals corresponding to the programming decision signals PB0 and PB1 of Embodiment 1 are data signals FB0T0 and FB1T0. When performing programming, H is inputted. When not performing programming, L is inputted.

As in FIG. 8, one to n data signals are programmed like (1, 0, . . . , 1) in the n electrical fuse cores 101 in the electrical fuse block 400 of the second stage to be programmed.

For this purpose, data is transferred such that FB0T0 (since the electrical fuse block of the initial stage is not programmed, FB0Ti are all set at L, i=0 to n) and FB1T0 are set at L and H, respectively.

The program enable signal FPGI and the program clock signal PCK are not operated but fixed at L until the completion of data transfer.

The data signal FSI is inputted to the initial stage of the electrical fuse block 400, and data is transferred in response to the clocking operation of the data clock signal FSCK until the data is transferred to the first to n-th stages of the data shift register block in the electrical fuse block of the second stage through the data shift register block 102. Since programming is not performed in the initial stage, L is finally outputted as the data transmission signal FA0Ti and the data signal FB0Ti.

In the second stage, the outputs of the data signal FB1Ti of the first to n-th stages are set at (H, L, . . . , H).

The data signal is transferred thus to each of the electrical fuse blocks 400.

After the completion of data transfer, the program enable signal is transferred and the inputted data is programmed.

As in Embodiment 1, the program enable signal is not transmitted to the program shift register block 103 in the electrical fuse block 400 of the initial stage according to the data signal FB0T0=L and FB1T0=H which correspond to the programming decision signals PB0 and PB1 of Embodiment 1, and L is always outputted as PA0Ti and PB0Ti. In other words, the electrical fuse elements of the electrical fuse cores 101 in the electrical fuse block 400 of the initial stage are not programmed.

Meanwhile, the output signal NPB0 of the inverter circuit 111 is set at H in response to the input of the data signal FB0T0. The tristate buffer circuit 122 is enabled, fed with the program enable signal FPGI, and outputs the program enable signal FPGI0.

Since the data signal FB1T0 (corresponding to the programming decision signal PB1) is set at H, the program enable signal FPGI0 is transmitted to the signal PA1ST.

After the program enable signal FPGI is inputted to the initial stage of the electrical fuse block 400 through the above operations, the signal is transmitted to the initial stage of the program shift register block 103 in the electrical fuse block 400 of the second stage.

The program enable signal FPGI0 is raised from L to H in the initial stage of the program shift register block 103 in the electrical fuse block 400 of the second stage while setup is sufficiently kept for the rising edge of the program clock signal PCK. Every time the periodic clocking operation of the program clock signal PCK is repeated, the program enable signal PBTi (i=1 to n) is sequentially generated as a pulse signal having a width equivalent to one period of the signal PCK, and the program enable transmission signal PA1Ti (i=1 to n) is similarly transmitted in a sequential manner to the shift registers 107 of the subsequent stage.

When the pulse signal of the program enable signal PB1Ti is inputted to the two-input AND circuit 106 of the electrical fuse core 101, a programmable state is generated as described above. Thus, based on program data signals (FB1T1, FB1T2, FB1Tn)=(1, 0, . . . , 1), the state of the output IN1Ti (i=1 to n) of the two-input AND circuit 106 is determined according to the rising edge of the signal PCK. In FIG. 7, IN1T0 is set at H, the NMOS transistor 105 is turned on only in a time interval equivalent to the pulse width of IN1T0, and the first electrical fuse element 104 is melted. IN1T1 is set at L, the NMOS transistor 105 is turned off, and the second electrical fuse element 104 is not melted. IN1Tn is set in a similar manner to IN1T0 and the (n+1)th electrical fuse element 104 is melted.

In this way, the program enable signal FPGI skips the program shift register block 103 in the electrical fuse block 400 of the initial stage and is transferred to the electrical fuse block 400 of the subsequent stage, and the program enable signal is sequentially transmitted according to the transferred data signal, so that programming is performed.

As described above, by the operation of the transmission circuit according to the data signal FBmT0 (programming decision signal PBm), the program enable signal FPGI is sequentially transmitted to the shift registers 107 in the program shift register block 103 during programming, and the program enable signal PBmTi is outputted to the NMOS transistor 105 through the AND circuit 106 of the electrical fuse core 101 to perform programming and the signal is transmitted to the electrical fuse block 100 of the subsequent stage. When not performing programming, the program enable signal FPGI skips the shift registers 107 in the data shift register block 103 and is transmitted to the electrical fuse blocks 100 of the subsequent stage and later.

As a result, it is possible to achieve an excellent electrical fuse module whereby when writing (programming) is performed on a specific data block of a space area, the transfer time of the program enable signal can be shortened and the power consumption of transmission can be reduced. Further, the electrical fuse core 101 not having been programmed can be skipped during verification, reducing check time.

In the data shift register block 102 for receiving input, the data signal FBmT0 of the first stage is used as a programming decision signal. The data signal FBmT0 is present as a signal equal to or equivalent to the programming decision signal. Thus it is possible to achieve an excellent electrical fuse module which eliminates the need for additional signal or terminal for deciding programming.

As a result, for example, when using an electrical fuse as OTP memory mountable in a consumer appliance having a function such as a secure ID, writing can be performed in a shorter time with low power consumption.

In the semiconductor storage device including the electrical fuse module of the present invention, program data has to be serially transferred in view of the property of melting (programming) through passage of current. The semiconductor storage device is useful for QTP memory or the like which can shorten programming time in random writing of additional programming and soon, and can be mounted in a consumer appliance having a function such as a secure ID.

What is claimed is:

1. A semiconductor storage device comprising an electrical fuse module,
   the electrical fuse module comprising electrical fuse blocks of a plurality of stages each including a plurality of electrical fuse cores in each of which programming can be performed by passing current through a fuse element and melting the fuse element,
   the electrical fuse core including a switch which is driven by input of a program enable signal for enabling the programming and a data signal for the programming and passes current through the fuse element to perform programming,
   the electrical fuse block including:
   a program shift register block made up of shift registers which are disposed for the respective electrical fuse cores, sequentially transmit the program enable signal, and output the program enable signal to the switches of the electrical fuse cores, and
   a transmission circuit which sequentially transmits the program enable signal to the shift registers in the program shift register block when performing programming according to a programming decision signal for determining whether or not programming is necessary for the electrical fuse core, outputs the program enable signal to the switches of the electrical fuse cores to perform programming, and transmits the program enable signal to the electrical fuse block of a subsequent stage, the transmission circuit causing, when not performing programming, the program enable signal to skip the shift registers in the program shift register block and transmitting the program enable signal to the electrical fuse blocks of the subsequent and later stages.

2. The semiconductor storage device comprising the electrical fuse module according to claim 1, wherein the electrical fuse block including a data shift register block made up of shift registers of stages as many as the electrical fuse cores, the shift registers being disposed for the respective electrical fuse cores, sequentially transmitting a data signal for the programming, and outputting the data signal to the switches of the electrical fuse cores, and
   the transmission circuit sequentially transmits the data signal to the shift registers in the data shift register block when performing programming according to the programming decision signal, outputs the data signal to the switches of the electrical fuse cores to perform programming, and transmits the data signal to the electrical fuse block of the subsequent stage, the transmission circuit causing, when not performing programming, the data signal to skip the shift registers in the data shift register block and transmitting the data signal to the electrical fuse blocks of the subsequent and later stages.

3. A semiconductor storage device comprising an electrical fuse module,
   the electrical fuse module comprising electrical fuse blocks of a plurality of stages each including a plurality of electrical fuse cores in each of which programming can be performed by passing current through a fuse element and melting the fuse element,
   the electrical fuse core including a switch which is driven by input of a program enable signal for enabling the programming and a data signal for the programming and passes current through the fuse element to perform programming,
   the electrical fuse block including:
   a program shift register block made up of shift registers which are disposed for the respective electrical fuse cores, sequentially transmit the program enable signal, and output the program enable signal to the switches of the electrical fuse cores,
   wherein when programming is performed in the shift registers of the program shift register block according to a programming decision signal for determining whether or not programming is necessary for the electrical fuse core, the program enable signal is outputted to the switch of the electrical fuse core to perform programming and transmitted to the shift register of a subsequent stage, and the program enable signal is transmitted, when not performing programming, to the shift registers of the subsequent and later stages.

4. The semiconductor storage device comprising the electrical fuse module according to claim 3, wherein the electrical fuse block including a data shift register block made up of shift registers of stages as many as the electrical fuse cores, the shift registers being disposed for the respective electrical fuse cores, sequentially transmitting a data signal for the programming, and outputting the data signal to the switches of the electrical fuse cores, and
   when programming the shift registers of the data shift register block according to the programming decision signal, the data signal is outputted to the switch of the electrical fuse core to perform programming and transmitted to the shift register of the subsequent stage, and the data signal is transmitted, when not performing programming, to the shift registers of the subsequent and later stages.

5. A semiconductor storage device comprising an electrical fuse module,
   the electrical fuse module comprising electrical fuse blocks of a plurality of stages each including a plurality of electrical fuse cores in each of which programming can be performed by passing current through a fuse element and melting the fuse element,
   the electrical fuse core including a switch which is driven by input of a program enable signal for enabling the programming and a data signal for the programming and passes current through the fuse element to perform programming,
   the electrical fuse block including:
   a program shift register block made up of shift registers which are disposed for the respective electrical fuse cores, sequentially transmit the program enable signal, and output the program enable signal to the switches of the electrical fuse cores, a data shift register block made up of shift registers of stages as many as the electrical fuse cores, the shift registers being disposed for the respective electrical fuse cores, sequentially transmitting a data signal for the programming, and outputting the data signal to the switches of the electrical fuse cores, and a transmission circuit which sequentially transmits, when performing programming according to a programming decision signal, the program enable signal to the shift registers in the program shift register block, outputs the program enable signal to the switches of the electrical fuse cores to perform programming, and transmits the program enable signal to the electrical fuse block of a subsequent stage, the transmission circuit causing, when not performing programming, the program enable signal to skip the shift registers in the program shift register block and transmitting the program enable signal to the electrical fuse blocks of the subsequent and later stages, wherein the data signal inputted to the data shift register block includes decision data for deciding whether or not programming is necessary or includes data equivalent to the decision data, and the decision data or the data equivalent to the decision data is used as a programming decision signal for determining whether or not programming is necessary for the electrical fuse core.

\* \* \* \* \*